United States Patent
Leese de Escobar et al.

(10) Patent No.: US 10,295,614 B2
(45) Date of Patent: May 21, 2019

(54) METHODS, DEVICES, AND INTEGRATED CIRCUITS FOR AUTOMATICALLY ADJUSTING A TRANSFER FUNCTION OF A SENSING DEVICE BASED ON A POWER LEVEL OF AN INCIDENT ELECTROMAGNETIC SIGNAL

(71) Applicant: SPAWAR Systems Center Pacific, San Diego, CA (US)

(72) Inventors: Anna M. Leese de Escobar, Encinitas, CA (US); Robert L. Fagaly, Carlsbad, CA (US); Susan Anne Elizabeth Berggren, San Diego, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 28 days.

(21) Appl. No.: 15/704,329

(22) Filed: Sep. 14, 2017

(65) Prior Publication Data
US 2019/0079145 A1 Mar. 14, 2019

(51) Int. Cl.
*G01R 33/035* (2006.01)
*H01L 39/22* (2006.01)
(Continued)

(52) U.S. Cl.
CPC ..... *G01R 33/0354* (2013.01); *G01R 33/0017* (2013.01); *G01R 33/0094* (2013.01); *G01R 33/0206* (2013.01); *H01L 39/223* (2013.01)

(58) Field of Classification Search
CPC .................................................. G01R 33/0354
See application file for complete search history.

(56) References Cited

U.S. PATENT DOCUMENTS

| | | |
|---|---|---|
| 5,469,057 A | 11/1995 | Robinson |
| 8,179,133 B1 | 5/2012 | Kornev et al. |
| 2015/0177286 A1* | 6/2015 | Fuji .................... G01R 33/0005 324/144 |

OTHER PUBLICATIONS

P. Longhini, S. Berggren, A. Leese de Escobar, A. Palacios, S. Rice, B. Taylor, V. In, O. A. Mukhanov, G. Prokopenko, M. Nisenoff, E. Wong, and M. C. De Andrade, "Voltage response of non-uniform arrays of bi-superconductive quantum interference devices," J. Appl. Phys. 111, 093920, May 2012.

(Continued)

*Primary Examiner* — Clayton E. LaBalle
*Assistant Examiner* — Jas A Sanghera
(74) *Attorney, Agent, or Firm* — Naval Information Warfare Center, Pacific; Kyle Eppele

(57) ABSTRACT

The transfer function of a sensing device including a plurality of sensors is automatically adjusted based on a power level of an incident electromagnetic signal detected by the plurality of sensors. Each of the plurality of sensors is associated with a unique transfer function. An output from one of the plurality of sensors associated with a particular transfer function is automatically selected based on a power level of the detected incident electromagnetic signal. Responsive to a change in the power level of the detected electromagnetic signal, another output from a different one of the plurality of sensors associated with a different transfer function is selected. The transfer function is adjusted over time by automatically selecting outputs from different ones of the plurality of sensors based on changes in the power level of the detected incident electromagnetic signal.

8 Claims, 3 Drawing Sheets

(51) Int. Cl.
*G01R 33/00* (2006.01)
*G01R 33/02* (2006.01)

(56) References Cited

OTHER PUBLICATIONS

V. K. Kornev, I. I. Soloviev, N. V. Klenov, and O. A. Mukhanov, "Bi-SQUID: a novel linearization method for dc SQUID voltage response," Superconductor Science and Technology, vol. 22, 114011, Nov. 2009.

V. K. Kornev, I. I. Soloviev, N. V. Klenov, and 0O A. Mukhanov, "Progress in high-linearity multi-element Josephson structures," Physica C, vol. 470, issue 19, pp. 886-869, Oct. 2010.

V. K. Kornev, I. I. Soloviev, N. V. Klenov, and O. A. Mukhanov, "Design and experimental evaluation of SQIF arrays with linear voltage response," IEEE Trans. Appl. Supercond., vol. 21, No. 3, pp. 394-398, Jun. 2011.

I. I. Soloviev, V. K. Kornev, N. V. Klenov and O. A. Mukhanov, "Superconducting Josephson structures with high linearity of transformation of magnetic signal into voltage," Physics of the Sold State, vol. 52, No. 11, pp. 2252-2258, 2010.

V. K. Kornev, I. I. Soloviev, N. V. Klenov, A. V. Sharafiev, and ). A. Mukhanov, "Linear Bi-SQUID arrays for electricaiiy small antennas," IEEE Trans. Appl. Supercond., vol. 21, No. 3, pp. 713-716, Jun. 2011.

V. K. Kornev, I. I. Soloviev, N. V. Klenov, and O. A. Mukhanov, "High linearity Josephson-junction array structures," Physica C, vol. 468, issue 7-10, pp. 813-816, Apr. 2008.

V. K. Kornev, I. I. Soloviev, N. V. Klenov, and O. A. Mukhanov, "High-linearity SQIF-like Josephson junction structures," IEEE Trans. Appl. Supercond., vol. 19, pp. 741-744, Jun. 2009.

V. K. Kornev, I. I. Soloviev, N. V. Klenov, T.V. Filippov, H. Engseth, and 0. A. Mukhanov, "Performance advantages and design issues of SQIFs for microwave applications," IEEE Trans. Appl. Supercond., vol. 19, pp. 916-919, Jun. 2009.

\* cited by examiner

METHODS, DEVICES, AND INTEGRATED CIRCUITS FOR AUTOMATICALLY ADJUSTING A TRANSFER FUNCTION OF A SENSING DEVICE BASED ON A POWER LEVEL OF AN INCIDENT ELECTROMAGNETIC SIGNAL

FEDERALLY-SPONSORED RESEARCH AND DEVELOPMENT

The United States Government has ownership rights in this invention. Licensing inquiries may be directed to Office of Research and Technical Applications, Space and Naval Warfare Systems Center, Pacific, Code 72120, San Diego, Calif., 92152; telephone (619) 553-5118; email: ssc_pac_t2@navy.mil, referencing NC 103413.

FIELD OF THE INVENTION

The present invention pertains generally to sensing incident electromagnetic signals at different power levels. More particularly, the present invention pertains to automatically adjusting a transfer function of a sensing device for accurately sensing incident electromagnetic signal at different power levels.

BACKGROUND OF THE INVENTION

Superconducting Quantum Interference Devices (SQUIDs) are sensitive magnetic field devices that are capable of detecting incident electromagnetic signals and producing an electrical signal in the form of a voltage response that is proportionate to the incident electromagnetic signal. SQUIDs are particularly useful for applications requiring sensing of weak electromagnetic signals. SQUIDs can be manufactured on small integrated circuits, making them very useful for applications in which sensing of an electromagnetic signal is important, but space is at a premium.

A typical SQUID includes a loop of superconducting material including one or more Josephson junctions. The voltage response of the SQUID, also referred to as the transfer function, depends on the size of the loop. SQUIDs are typically arranged in an array of identical SQUIDs having identical loop sizes.

The transfer function and the size of the loop of a typical SQUID are geared toward detecting weak incident electromagnetic signals at relatively lower power levels. In the presence of high power sources, such as a radar source, the SQUID becomes saturated, such that the SQUID is not able to output an electrical signal representative of the incident electromagnetic signal. Hence, typical SQUID arrays are limited in the sense that they are only able to accurately sense incident electromagnetic signals and output electrical signals representative of the sensed signals over a narrow and typically low power range.

There is thus a need for a SQUID device that is able to accurately sense incident electromagnetic signals and accurately produce electrical signals representative of the sensed electromagnetic signals over a wide range of power levels.

SUMMARY OF THE INVENTION

According to an illustrative embodiment, the transfer function of a sensing device including a plurality of sensors is automatically adjusted based on a power level of an incident electromagnetic signal detected by the plurality of sensors. Each of the plurality of sensors is associated with a unique transfer function. An output from one of the plurality of sensors associated with a particular transfer function is automatically selected based on a power level of the detected incident electromagnetic signal. Responsive to a change in the power level of the detected electromagnetic signal, another output from a different one of the plurality of sensors associated with a different transfer function is selected. The transfer function is adjusted over time by automatically selecting outputs from different ones of the plurality of sensors based on changes in the power level of the detected incident electromagnetic signal.

These, as well as other objects, features and benefits will now become clear from a review of the following detailed description, the illustrative embodiments, and the accompanying drawings.

BRIEF DESCRIPTION OF THE DRAWINGS

The novel features of the present invention will be best understood from the accompanying drawings, taken in conjunction with the accompanying description, in which similarly-referenced characters refer to similarly-referenced parts, and in which.

DETAILED DESCRIPTION OF THE EMBODIMENTS

According to illustrative embodiments, an array of sensors, including Superconducting Quantum Interference Devices (SQUIDs) arranged on a single integrated circuit, is used to detect incident electromagnetic signals over a wide range of power levels while maintaining high fidelity. Each of the sensors has a unique transfer function associated with it. For an incident electromagnetic signal at a power level within a particular power range, only the sensor associated with that power range will provide an electrical signal representative of the incident electromagnetic signal, according to the transfer function associated with that sensor. Combining the sensors on a single device allows a transfer function of the device to be automatically adjusted by passively selecting an output from the sensor that is associated with a power range within which the power level of the incident electromagnetic falls. Thus, incident electromagnetic signals may be detected over a wide power range, and electrical outputs representative of the incident electromagnetic signals may be accurately output using a single device.

Figure 1A:
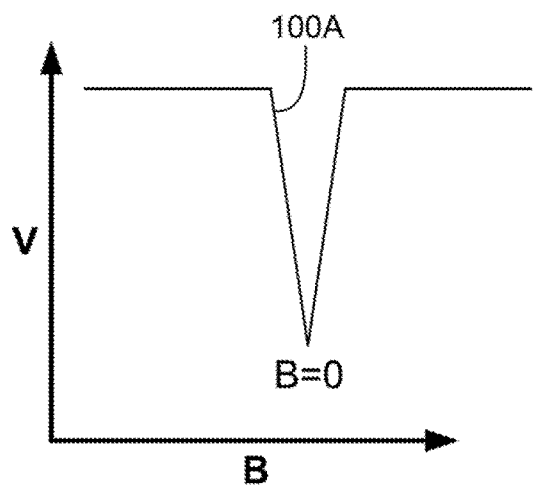
FIG. 1A and FIG. 1B illustrate examples of transfer functions associated with different SQUIDs included in a sensing device according to illustrative embodiments.
Figure 1B:
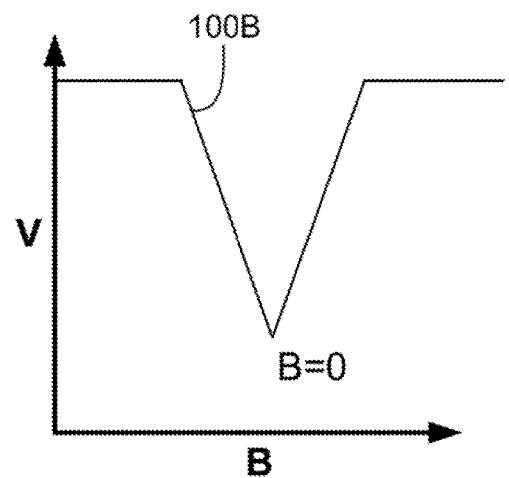

FIG. 1A and FIG. 1B illustrate examples of transfer functions associated with different SQUIDs included in a sensing device according to illustrative embodiments. Although only two transfer functions are shown for illustrative purposes, it should be appreciated than any number of transfer functions associated with a corresponding number of different SQUIDs or SQUID arrays may be used.

The transfer functions shown in FIG. 1A and FIG. 1B represent voltage responses of SQUIDs to incident electromagnetic signals. For both transfer functions, an anti-peak of a magnetic field B points to a local field or at B=0 when no field is present.

FIG. 1A shows a first transfer function 100A optimized for a low power signal. The transfer function has a steep slope which corresponds to a high gain. For a SQUID configured to have this transfer function, a small change in the magnetic field B causes a large change in the voltage V. Thus, a SQUID having this transfer function is able to produce a voltage signal as a linear response that represents a detected incident magnetic signal at a low power level, i.e., a low value of B. If the power level of the incident magnetic field is too high, the SQUID that is configured to have the first transfer function 100A will saturate, resulting in a flat response.

FIG. 1B shows a second transfer function 100B optimized for a high power signal. This transfer function has a less steep slope compared to the first transfer function 100A. The less steep slope corresponds to higher power tolerance. For a SQUID configured to have this transfer function, a large change in the magnetic field B causes a small change in the voltage V. Thus, a SQUID having this transfer function is able to produce a voltage signal as a linear response that represents a detected incident electromagnetic signal at a high power level, i.e., a high value of B. However, if the power level of the incident magnetic field is too high, the SQUID configured to have the transfer function 100B will eventually saturate, resulting in a flat response.

According to illustrative embodiments a sensing device including multiple sensors has a self-adjusting transfer function such that it is able to convert an incident electromagnetic signal into a proportionate electrical signal to avoid saturation. For a low power incident electromagnetic signal, the output of a sensor having an associated transfer function with a steep slope can be passively selected, resulting in greater gain. For a higher power incident electromagnetic signal, the output of a different sensor having an associated transfer function with a less steep slope can be used so as to avoid saturation.

Figure 2:
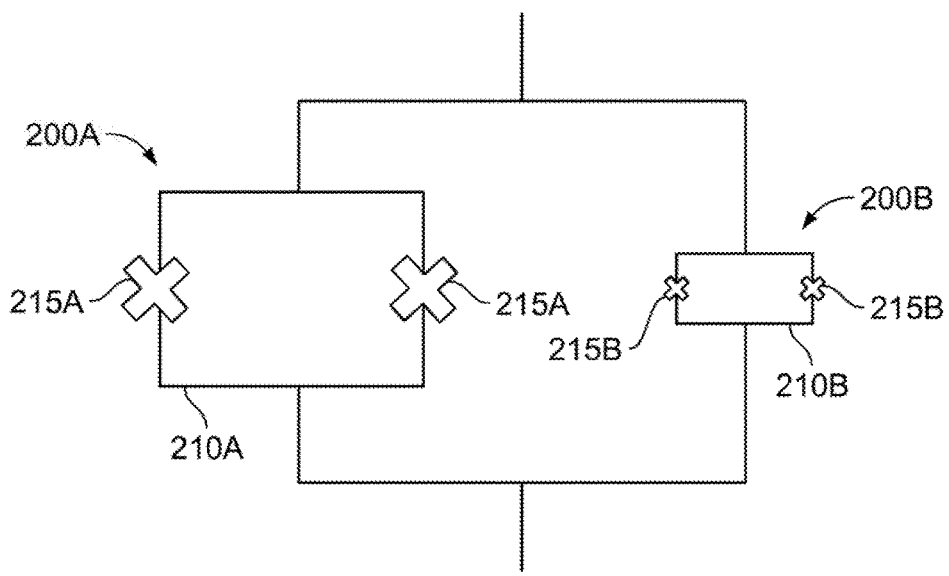
FIG. 2 illustrates an example of a multi-SQUID device having different loop sizes according to illustrative embodiments.

According to one embodiment the sensors include SQUIDs having different loop sizes, each configured to sense incident electromagnetic signals over a particular power range. FIG. 2 illustrates an example of a multi-SQUID device having different loop sizes according to an illustrative embodiment. As shown in FIG. 2, a multi-SQUID device includes a first SQUID 200A and a second SQUID 200B. The first SQUID 200A includes a first loop of superconducting material 210A and first Josephson Junctions 215A. The second SQUID 200B includes a second loop of superconducting material 210B and second Josephson Junctions 215B.

As can be seen from FIG. 2, the loop size of the first SQUID 200A is larger than the loop size of the second SQUID 200B. Thus, the first SQUID 200A is configured to gather more energy and hence is optimized to detect a low power electromagnetic signal and output a voltage representative of the detected signal. Such a SQUID is associated with a transfer function having a steep slope, such as the first transfer function 100A shown in FIG. 1A.

By contrast, the second SQUID 200B is configured to gather less energy and hence is optimized to detect a high power electromagnetic signal and output a voltage representative of the detected signal. Such a SQUID is associated with a transfer function having a less steep slope, such as the second transfer function 100B shown in FIG. 1B.

Although not shown, one or more amplifiers may be used to increase the gain of an output voltage representative of low power electromagnetic signals, even in the presence of high power electromagnetic signals.

Although the first and second SQUIDs 200A and 200B depicted in FIG. 2 are connected in parallel, it should be appreciated that they could be connected in series, with the same result.

Also, while only two SQUIDs are shown in FIG. 2, it should be appreciated that a sensing device may include hundreds of thousands of SQUIDs optimized to produce voltage responses at different power levels. Also, arrays of multiple SQUIDs having large loops and arrays of multiple SQUIDs having small loops could be used. These arrays may be coupled in any desired fashion to form a geometric shape, such as a circle or pyramid, which is optimized for a particular type of electromagnetic radiation, a particular system, etc.

According to an illustrative embodiment, several SQUIDs or arrays of SQUIDs having different loop sizes can be combined together with an offset in the electromagnetic field to provide a large combined response. This may be understood with reference to FIG. 3 which illustrates a combined voltage response achieved by a sensing device having a plurality of SQUIDs or SQUID arrays, each having different transfer functions according to illustrative embodiments. The combined voltage response $VR_C$ includes individual voltage responses $VR_1$, $VR_2$, $VR_3$, and $VR_4$. The individual voltage responses $VR_1$, $VR_2$, $VR_3$, and $VR_4$ are associated with four different SQUIDs or SQUID arrays, each of which has a loop size that is optimized to provide a voltage response for a detected incident electromagnetic signal a particular power range and to provide a flat response for a detected incident electromagnetic signal that is outside of that power range.

For example, a first SQUID may have a large loop size that is optimized to produce a voltage response $VR_1$ for a low power incident electromagnetic signal and provide a flat response once the power of the incident electromagnetic signal increases to a first threshold power level $B_1$. That is, the first SQUID effectively turns on when an incident electromagnetic signal at a low power level is detected, and effectively saturates when the power level increases to the first threshold power level $B_1$.

A second SQUID may have a smaller loop size that is optimized to produce a voltage response $VR_2$ when the power level of the incident electromagnetic signal reaches the first threshold power level $B_1$ and produce a flat response once the power of the incident electromagnetic signal increases to a second threshold power level $B_2$. That is, the second SQUID effectively turns on when an incident electromagnetic signal at the first threshold power level $B_1$ is detected and effectively saturates when the power level increases to the second threshold power level $B_2$.

A third SQUID may have an even smaller loop size that is optimized to produce a voltage response $VR_3$ when the power level of the incident electromagnetic signal reaches the second threshold power level $B_2$ and produce a flat response once the power level of the incident electromagnetic signal increases to a third power level $B_2$. That is, the third SQUID effectively turns on when an incident electromagnetic signal at the second threshold power level B2 is detected and effectively saturates when the power level increases to the third threshold power level $B_3$.

A fourth SQUID may have the smallest loop size that is optimized to produce a voltage response $VR_4$ when the power level of the incident electromagnetic signal reaches the third threshold power level $B_3$. That is, the fourth SQUID effectively turns on when an incident electromagnetic signal at the third threshold power level $B_3$ is detected. The fourth SQUID will effectively saturate if the power level increases to a level for which the fourth SQUID is not optimized.

Figure 3:
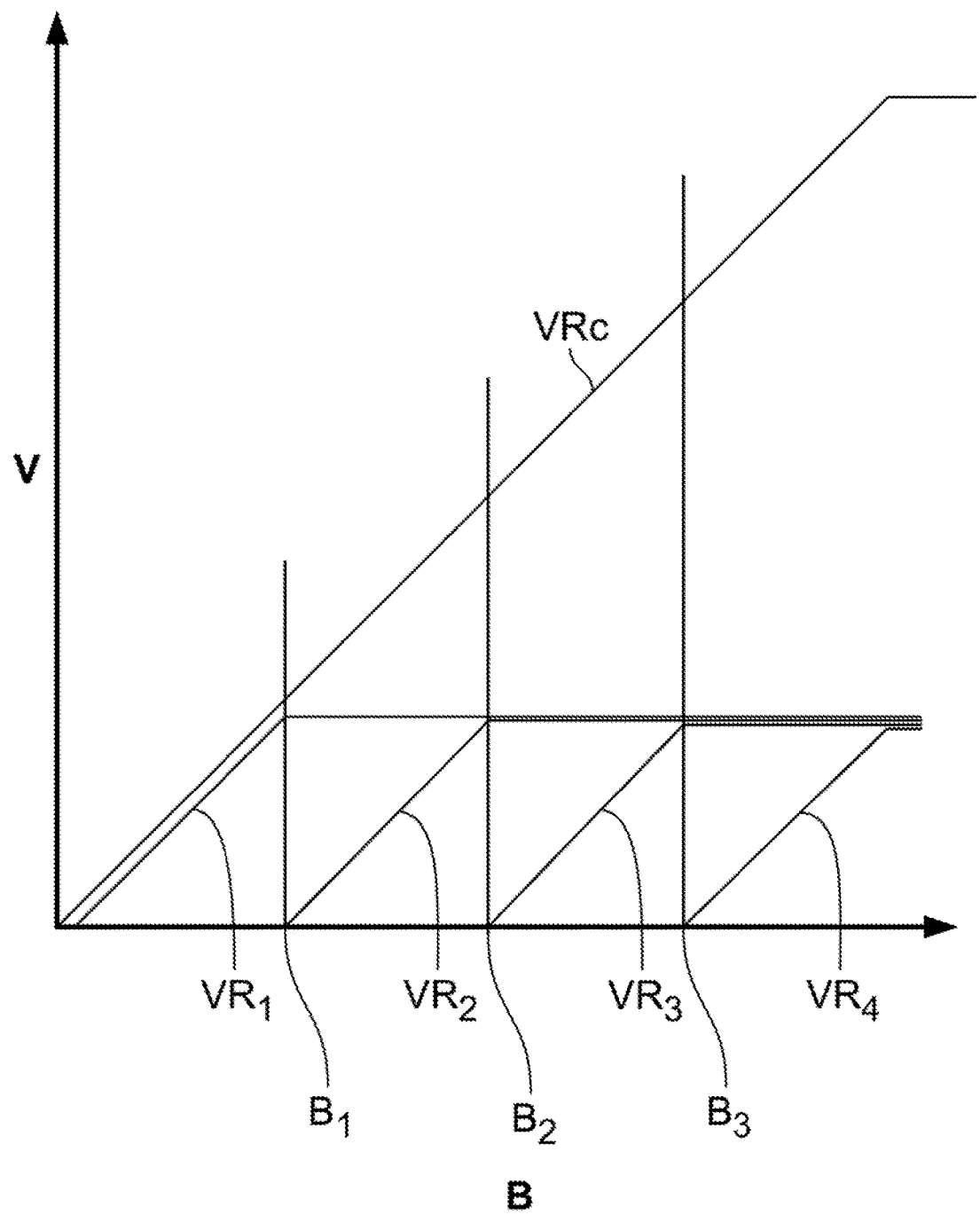
FIG. 3 illustrates an example of a combined voltage response of a sensing device including a plurality of SQUIDs with individual voltage responses according to illustrative embodiments.

As can be seen from FIG. 3, as the power level of an incident electromagnetic signal B increases, the different voltage responses $VR_1$, $VR_2$, $VR_3$, and $VR_4$ of the first, second, third and fourth SQUIDs, respectively, contribute to the combined voltage response $VR_C$. That is, as the power level of the incident magnet signal increases over time, the different SQUIDs effectively turn on and off, such that the outputs of the different SQUIDs are passively selected. As a result, although the voltage response of the sensing device is adjusted over time as the power level of the incident electromagnetic signal changes, the combined voltage response $V_{RC}$ of the sensing device remains linear over a wide power range.

Although the combined voltage response shown in FIG. 3 represents voltage responses of four SQUDs optimized for different power ranges, it should be appreciated that a sensing device may include any number of SQUIDs or SQUID arrays optimized for different power ranges.

According to an illustrative embodiment, turning the SQUIDs or SQUID arrays on and off may be accomplished in a variety of different ways. For example, the critical current of each SQUID may be set at a level such that the SQUID is "off" and does not produce a voltage output for incident electromagnetic signal below a threshold power level, and only produces a voltage output when the incident electromagnetic signal reaches the threshold power level. As an alternative, the saturation of a SQUID having a large loop size could trigger an outer circuit that may turn on the critical current of a SQUID having a smaller loop size. As yet another alternative, the saturation of a SQUID having a large loop size could trigger an outer circuit to close a switch that would cause a voltage output of a SQUID having a smaller loop size to be added to the combined voltage output. Also, a hybrid of these techniques may be used.

It should be appreciated that for each of these techniques, in the case of sensing devices using SQUID arrays, the SQUID arrays would be designed such that they are associated with particular transfer functions and voltage responses. That is, arrays of different sizes, each associated with a particular transfer function, may have different numbers of SQUIDs having different loop sizes coupled in series and parallel. For example, a large array having a large number of SQUIDs with large loop sizes may be associated with a steep transfer function, while a smaller array having a smaller number of SQUIDs with smaller loop sizes may be associated with a less steep transfer function. The arrays may also have different flux biases, such that the arrays are offset in the electromagnetic field.

Figure 4:
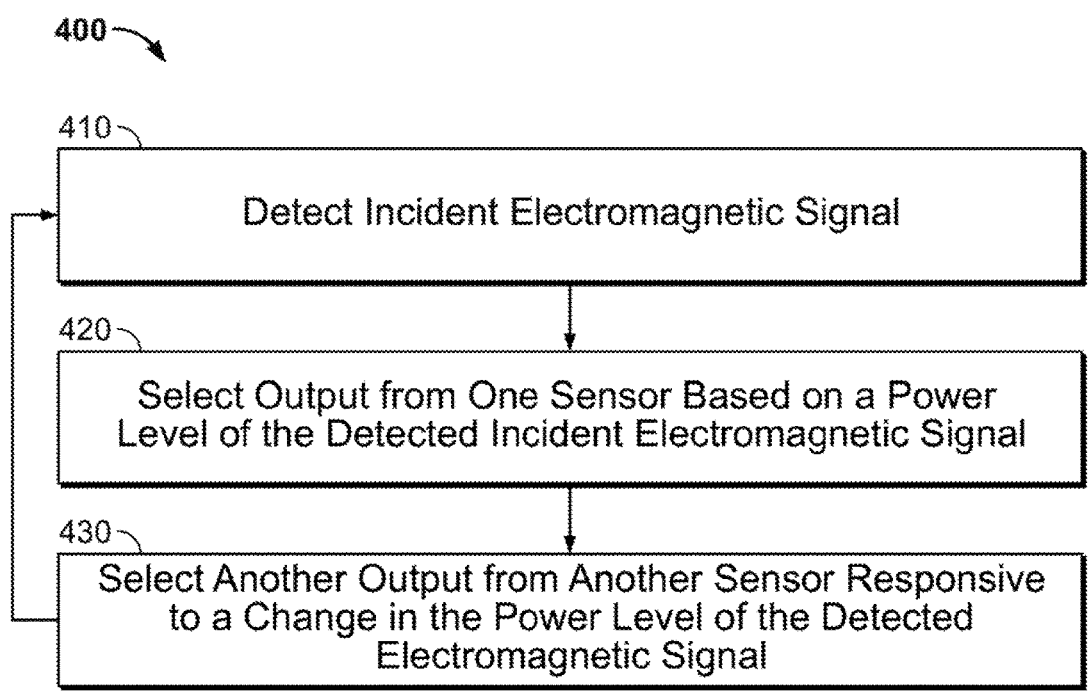
FIG. 4 is a flow chart showing steps in a process for adjusting a transfer function to produce electrical signals representing incident electromagnetic signals detected over a wide power range according to an illustrative embodiment.

FIG. 4 is a flow chart showing steps in a process for automatically adjusting a transfer function of a sensing device to produce electrical signals representing incident electromagnetic signals detected over a wide power range, according to illustrative embodiments. It should be appreciated that the steps and order of steps described and illustrated are provided as examples. Fewer, additional, or alternative steps may also be involved and/or some steps may occur in a different order.

Referring to FIG. 4, the process 400 begins at step 410 at which an incident electromagnetic signal is detected by a plurality of sensors, such as an array of SQUIDs having different loop sizes. Each of the plurality of sensors is associated with a unique transfer function and is optimized to produce an output representative of the detected incident electromagnetic signal over a particular power range. For example, each particular sensor is associated with a unique voltage response and is optimized to produce a voltage representative of the incident electromagnetic signal detected over a particular power range associated with that particular sensor.

At step 420, an output from one of the plurality of sensors associated with a particular transfer function is automatically selected based on a power level of the detected incident electromagnetic signal. The output is an electrical signal that represents the detected incident electromagnetic signal.

At step 430, another output from a different one of the plurality of sensors associated with a different transfer function is selected, responsive to a change in the power level of the detected incident electromagnetic signal. The output is another electrical signal that represents the detected incident electromagnetic signal.

Steps 410-430 are repeated over time as the power level of the detected incident electromagnetic signal changes. Thus, over time, the transfer function of the sensing device is adjusted by selecting outputs from different ones of the plurality of sensors based on changes in the power level of the detected incident electromagnetic signal.

Although, in the embodiments described above, SQUIDs are described above as the sensing devices, individual Josephson Junctions, bi-SQUIDs or arrays of Josephson Junctions or bi-SQUIDs could be used. As a bi-SQUID is a SQUID with an additional junction bisecting the superconducting loop, the voltage response output from a bi-SQUID has greater linearity compared to that of a SQUID.

Further, in the embodiments described above, the outputs of SQUIDs having different loop sizes are passively selected based on the power level of an incident electromagnetic signal to produce a combined voltage response over a wide power range. It should be appreciated that other SQUID designs may be used to achieve the same results.

For example, instead of using SQUIDs with different loop sizes optimized for different power ranges, SQUIDs having different Josephson Junction thicknesses optimized for different power ranges may be used. Also, superconductive material parameters of the SQUIDs can be tuned such that each SQUID is optimized to produce a voltage response to detected electromagnetic signals over a particular power range.

By optimizing the loop size, Josephson Junction thickness and/or superconductive material for each SQUID or SQUID array, the inductance of each SQUID or SQUID array is optimized to produce a voltage response for an incident electromagnetic signal over a particular power range. It should be appreciated that other parameters, such as the bias current or critical current, could be optimized for each SQUID or SQUID array to cause the SQUID or SQUID array to produce a voltage response for an incident electromagnetic signal detected over a particular power range.

It should further be appreciated that, instead of using SQUIDs or SQUID arrays with different designs, structures surrounding the SQUIDs or SQUID arrays could be designed to have intrinsic limits which would cause different SQUIDs or SQUID arrays to automatically turn on or off based on the power level of an incident electromagnetic signal. For example, structures having impedance and/or resonance values designed to cause the SQUIDs or SQUID arrays to provide specific voltage responses for incident electromagnetic signals at different power levels could be created around the SQUIDs or SQUID arrays. These structures could include ring-like or coplanar waveguide-like structures with varied characteristic impedances or coplanar structures designed to control the power level which a SQUID or SQUID array responds to. These structures may also include a resonator having a size and shape that controls the power level to which a SQUID or SQUID array responds. Further, any surrounding conductive structure that controls the power level to which a SQUID or SUID array responds could be used.

In addition, the design of the structures surrounding the SQUIDs or SQUID arrays and the design of the SQUIDs and SQUID arrays could be used in combination to cause the SQUIDs or SQUID arrays to produce different voltage responses for incident electromagnetic signals at different power levels.

It will be understood that many additional changes in the details, materials, steps and arrangement of parts, which have been herein described and illustrated to explain the nature of the invention, may be made by those skilled in the art within the principle and scope of the invention as expressed in the appended claims.

What is claimed is:

1. A method for adjusting a transfer function of a sensing device including a plurality of sensors, the method comprising:

detecting, by the plurality of sensors, an incident electromagnetic signal, wherein each of the plurality of sensors is associated with a unique transfer function;

automatically selecting an output from one of the plurality of sensors associated with a particular transfer function based on a power level of the detected incident electromagnetic signal; and automatically selecting another output from a different one of the plurality of sensors associated with a different transfer function responsive to a change in the power level of the detected electromagnetic signal, wherein the transfer function of the sensing device is adjusted over time by automatically selecting outputs from different ones of the plurality of sensors based on changes in the power level of the detected incident electromagnetic signal;

wherein each of the plurality of sensors includes at least one of: a Josephson Junction, a superconducting quantum interference device (SQUID), a bi-SQUID, an array of Josephson Junctions, an array of SQUIDs, and an array of bi-SQUIDs.

2. An integrated circuit, comprising:

a first superconducting quantum interference device (SQUID) configured to detect an incident electromagnetic signal; and at least a second SQUID configured to detect the incident electromagnetic signal, wherein the first SQUID is associated with a first voltage response and is further configured to produce a first voltage representative of the detected incident electromagnetic signal when a power level of the detected incident electromagnetic signal is within a first power range, the second SQUID is associated with a second voltage response and is further configured to produce a second voltage representative of the incident electromagnetic signal when the power level of the detected incident electromagnetic signal is within a second power range, and an output of the integrated circuit automatically switches between the first voltage produced by the first SQUID and the second voltage produced by the second SQUID based on the power level of the detected incident electromagnetic signal.

3. The integrated circuit of claim 2, wherein the first SQUID is further configured to output a flat response responsive to the power level of the detected incident signal being outside the first power range, and the second SQUID is further configured to output the flat response responsive to the power level of the detected incident signal being outside the second power range.

4. The integrated circuit of claim 2, wherein the first SQUID has a first loop size, and the second SQUID has a second loop size.

5. The integrated circuit of claim 4, wherein the first loop size is larger than the second loop size.

6. The integrated circuit of claim 2, further comprising a first array including a plurality of first SQUIDs and a second array including a plurality of second SQUIDs.

7. The integrated circuit of claim 6, wherein the first array and second array are connected in parallel or series.

8. The integrated circuit of claim 6, wherein the first array and the second array are arranged in a geometric shape including at least one of a circular shape and a pyramid shape.

* * * * *